United States Patent
Frank et al.

(10) Patent No.: US 8,859,410 B2
(45) Date of Patent: Oct. 14, 2014

(54) GATE STACK OF BORON SEMICONDUCTOR ALLOY, POLYSILICON AND HIGH-K GATE DIELECTRIC FOR LOW VOLTAGE APPLICATIONS

(71) Applicant: International Business Machines Corporation, Armonk, NY (US)

(72) Inventors: Martin M. Frank, Dobbs Ferry, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/828,846

(22) Filed: Mar. 14, 2013

(65) Prior Publication Data

US 2014/0264638 A1    Sep. 18, 2014

(51) Int. Cl.
  H01L 21/336    (2006.01)
  H01L 29/423    (2006.01)

(52) U.S. Cl.
  CPC ............................... *H01L 29/42364* (2013.01)
  USPC .... 438/560; 257/325; 257/310; 257/E21.423; 257/E21.151

(58) Field of Classification Search
  USPC .......... 257/E21.423, 325, 310, 410, E21.151, 257/E21.162, E21.433, E21.637, E21.639, 257/E29.132, E29.154, E29.158, 324; 438/287
  See application file for complete search history.

(56) References Cited

U.S. PATENT DOCUMENTS

| | | | |
|---|---|---|---|
| 5,753,530 A | 5/1998 | Akamine et al. | |
| 7,423,326 B2 | 9/2008 | Rotondaro et al. | |
| 7,768,072 B2 | 8/2010 | Tsai et al. | |
| 8,035,173 B2 | 10/2011 | Bu et al. | |
| 8,237,233 B2 * | 8/2012 | Anderson et al. | 257/407 |
| 2011/0175176 A1 * | 7/2011 | Frank | 257/411 |
| 2012/0025287 A1 | 2/2012 | Golubovic | |

* cited by examiner

*Primary Examiner* — Zandra Smith
*Assistant Examiner* — Paul Patton
(74) *Attorney, Agent, or Firm* — Scully, Scott, Murphy & Presser, P.C.; Louis J. Percello, Esq.

(57) ABSTRACT

A method of forming a gate structure for a semiconductor device that includes forming a non-stoichiometric high-k gate dielectric layer on a semiconductor substrate, wherein an oxide containing interfacial layer can be present between the non-stoichiometric high-k gate dielectric layer and the semiconductor substrate. At least one gate conductor layer may be formed on the non-stoichiometric high-k gate dielectric layer. The at least one gate conductor layer comprises a boron semiconductor alloy layer. An anneal process is applied, wherein during the anneal process the non-stoichiometric high-k gate dielectric layer removes oxide material from the oxide containing interfacial layer. The oxide containing interfacial layer is thinned by removing the oxide material during the anneal process.

16 Claims, 2 Drawing Sheets ent of forming a first semiconductor containing conductor
GATE STACK OF BORON SEMICONDUCTOR ALLOY, POLYSILICON AND HIGH-K GATE DIELECTRIC FOR LOW VOLTAGE APPLICATIONS

BACKGROUND

The present disclosure relates generally to semiconductor integrated circuits. More particularly, the present disclosure relates to scaling of semiconductor devices, such as metal oxide semiconductor field effect transistors. In order to be able to make integrated circuits, such as memory, logic and other devices, of higher integration density than currently feasible, one has to find ways to further downscale the dimensions of field effect transistors, such as metal oxide semiconductor field effect transistor and complementary metal oxide semiconductors. Scaling achieves compactness and improves operating performance in devices by shrinking the overall dimensions of the device.

SUMMARY

In one embodiment, the present disclosure provides a method of forming a gate structure for a semiconductor device that includes forming a non-stoichiometric high-k gate dielectric layer on a semiconductor substrate, wherein an oxide containing interfacial layer is present between the non-stoichiometric high-k gate dielectric layer and the semiconductor substrate. At least one gate conductor layer may be formed including a boron semiconductor alloy layer on the non-stoichiometric high-k gate dielectric layer. The at least one gate conductor layer includes a boron semiconductor alloy layer that reduces a strength of an electric field that is produced during burn in when compared to a similarly structured semiconductor device having a metal gate conductor.

In another aspect, a semiconductor device is provided that includes a semiconductor substrate including a channel region, a source region and a drain region, wherein the source region and the drain region are on opposing sides of the channel region. In one embodiment, a gate structure is present on the channel region of the semiconductor substrate, wherein the gate structure includes an interfacial oxide containing layer that is in direct contact with the channel region, a high-k gate dielectric layer that is present on the interfacial oxide containing layer, and a semiconductor containing gate conductor stack including a boron semiconductor alloy layer present on the high-k gate dielectric layer. The at least one gate conductor layer including a boron semiconductor alloy layer reduces a strength of an electric field that is produced during burn in when compared to a similarly structured semiconductor device having a metal gate conductor.

DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
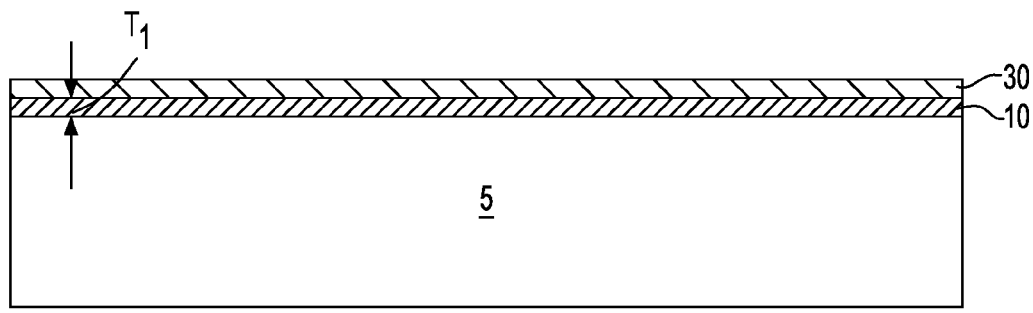
FIG. 1 is a side cross-sectional view depicting forming a non-stoichiometric high-k gate dielectric layer on a semiconductor substrate, wherein an oxide containing interfacial layer can be present between the non-stoichiometric high-k gate dielectric layer and the semiconductor substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "vertical", "horizontal", "top", "bottom", and derivatives thereof shall relate to the disclosed structures and methods, as oriented in the drawing figures.

In complementary metal oxide semiconductor scaling, applications with low threshold voltage (Vdd) and low power requirements drive gate stack scaling towards a different optimization point then high performance logic tends to. For example, carrier depletion in a semiconductor electrode is not really a disadvantage for semiconductor devices having a low voltage threshold (Vdd), where the impact is very little, if any, and depletion in the gate electrode would tend to benefit reliability, and therefore, potentially enable more aggressive dielectric scaling and better electrostatic channel control, which is a good fit for devices having a low threshold voltage (Vdd). Additional dielectric scaling for lower threshold voltage (Vdd) applications is important, as will drive off currents to be lower at a given device channel length and operational voltage. In the methods and structures disclosed herein, a gate structure is provided in which scaling for the equivalent oxide thickness (EOT) is optimized for lower threshold voltage (Vdd) operation. The gate structure provided by the methods and structures disclosed herein may also include a boron semiconductor alloy layer that is separated from the high-k gate dielectric layer of the gate structure, wherein the boron semiconductor alloy layer can function as a depletion stop for the semiconductor materials within the gate structure.

FIGS. 1-7 depict one embodiment of a method for forming a semiconductor device in which a non-stoichiometric high-k gate dielectric layer 30 may be formed on a semiconductor substrate 5 to provide the gate dielectric of the gate structure 40 to a semiconductor device. Typically, an oxide containing interfacial layer 10 is present between the semiconductor substrate 5 and the non-stoichiometric high-k gate dielectric layer 30. During a subsequent anneal process, the non-stoichiometric high-k gate dielectric layer 30 removes oxide from an oxide containing interfacial layer 10 that is underlying the non-stoichiometric high-k gate dielectric layer 30. By scavenging the oxide from the oxide containing interfacial layer 10, the oxide containing interfacial layer 10 can be thinned. The semiconductor device may be any semiconductor device that includes a gate structure 40. As used herein, "semiconductor device" refers to an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor determine the conductivity type of the semiconductor, e.g., n-type or p-type conductivity. Although, FIGS. 1-7 of the present disclosure depicts a field effect transistor (FET), any semiconductor device having a gate structure 40 is applicable to the present disclosure.

FIG. 1 depicts one embodiment of a non-stoichiometric high-k gate dielectric layer 30 being formed on a semiconductor substrate 5, wherein an oxide containing interfacial layer 10 can be present between the non-stoichiometric high-k gate dielectric layer 30 and the semiconductor substrate 5. The semiconductor substrate 5 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate 5 may also be composed of other semiconductor materials, such as germanium, and compound semiconductor substrates, such as type III/V semiconductor substrates, e.g., GaAs. Although the semiconductor substrate 5 is depicted as a bulk semiconductor substrate, semiconductor on insulator (SOI) substrate arrangements, such as silicon on insulator substrates, are also suitable for the semiconductor substrate 5. The semiconductor substrate 5 may also include a doped (n- or p-) region. For clarity, the doped regions are not specifically labeled in the drawings of the present application. These doped regions are known as "wells". The dopant for the well regions may be introduced to the semiconductor substrate 5 using ion implantation.

Still referring to FIG. 1, a non-stoichiometric high-k gate dielectric layer 30 may be formed on the semiconductor substrate 5. The term "high-k" denotes a material having a dielectric constant that is greater than the dielectric constant of silicon oxide ($SiO_2$). For example, the non-stoichiometric high-k gate dielectric layer 30 can have a dielectric constant that is greater than 3.9. In another example, the non-stoichiometric high-k gate dielectric layer 30 has a dielectric constant that is greater than 10. In yet another embodiment, the non-stoichiometric high-k gate dielectric layer 30 is comprised of a material having a dielectric constant ranging from 10 to 30. The dielectric constants mentioned herein are relative to a vacuum at room temperature, i.e., 20° C. to 25° C.

The term "non-stoichiometric" refers to any chemical compound in which the number of atoms of each element is not expressible as the ratio of small integers, which can be the result of missing atoms in a solid state lattice. The non-stoichiometric high-k gate dielectric layer 30 can include at least one metallic element. Some examples of high-k dielectric materials suitable for the non-stoichiometric high-k gate dielectric layer 30 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the non-stoichiometric high-k gate dielectric layer 30 is a hafnium containing material, such as $HfO_{(2-y)}$, wherein y is greater than 0 and smaller than 2. In another embodiment, y is greater than 1 and smaller than 2.

The non-stoichiometric high-k gate dielectric layer 30 is typically formed using a deposition process, such as chemical vapor deposition. Variations of chemical vapor deposition processes for depositing the high-k gate dielectric layer 15 include, but are not limited to, atmospheric pressure chemical vapor deposition, low pressure chemical vapor deposition and plasma enhanced chemical vapor deposition, metal organic chemical vapor deposition and combinations thereof. In yet another embodiment, the non-stoichiometric high-k gate dielectric layer 30 may be formed using physical vapor deposition (PVD), such as, pulsed laser deposition, evaporation, sputtering, molecular beam epitaxial (MBE) deposition or a combination thereof. In yet still another embodiment, the non-stoichiometric high-k gate dielectric layer 30 may be formed using atomic layer deposition (ALD). In one embodiment, the non-stoichiometric high-k gate dielectric layer 30 has a thickness that ranges from 1 nm to 10 nm. In another embodiment, the non-stoichiometric high-k gate dielectric layer 30 has a thickness that ranges from 1 nm to 4 nm.

The term "formed on", as used to describe the non-stoichiometric high-k gate dielectric layer 30 being formed on the semiconductor substrate 5, means that an intermediate layer may be present between the non-stoichiometric high-k gate dielectric layer 30 and the semiconductor substrate 30, such as an oxide containing interfacial layer 10. In some embodiments, the oxide containing interfacial layer 10 may be composed of an oxide, such as silicon oxide, or oxynitride, such as silicon oxynitride. The oxide containing interfacial layer 10 can be the result of thermal oxidation before or after the formation of the non-stoichiometric high-k gate dielectric layer 30. The oxide containing interfacial layer 10 may also be a chemical oxide that can be the result of a chemical cleaning composition applied to the semiconductor substrate 5. The oxide containing interfacial layer 10 may have a thickness T1 ranging from 0.5 nm to 5 nm. In another embodiment, the oxide containing interfacial layer 10 may have a thickness T1 ranging from 1 nm to 4 nm. In yet another embodiment, the oxide containing interfacial dielectric layer 10 may have a thickness T1 ranging from 2 nm to 3 nm. In another embodiment, the oxide containing interfacial layer 10 may have a thickness T1 ranging from 0.1 nm to 2 nm.

In one embodiment, the oxide containing interfacial oxide layer 10 is in direct contact with an upper surface of the semiconductor substrate 5, and the non-stoichiometric high-k gate dielectric layer 30 is in direct contact with the oxide containing interfacial oxide layer 10. The term "direct contact" means that a first element, such as a first structure, and a second element, such as a second structure, are connected without any intermediary conducting, insulating or semiconductor layers at the interface of the two elements.

Figure 2:
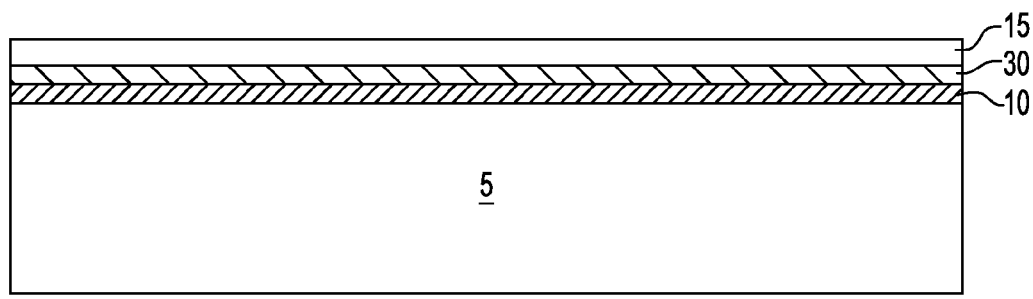
FIG. 2 is a side cross-sectional view depicting one embodiment of forming a first semiconductor containing conductor layer on the non-stoichiometric high-k gate dielectric layer.

FIG. 2 depicts one embodiment of forming a first semiconductor containing conductor layer 15 on the non-stoichiometric high-k gate dielectric layer 30. The first semiconductor containing conductor layer 15 may be a silicon containing material. Examples of silicon containing materials that are suitable for the first semiconductor containing conductor layer 15 include, but are not limited to, silicon (Si), single crystal silicon, polycrystalline silicon, amorphous silicon (α-Si), Si doped with C (Si:C) and the above-mentioned silicon-containing materials with some or all of the Si replaced by Ge. Other examples of semiconductor materials that are suitable for the first semiconductor containing conductor layer 15 may include GaSb, GaP, GaAs, InAs, InP, and all other III-V or II-VI compound semiconductors. In some embodiments, the first semiconductor containing conductor layer 15 is deposited using a physical vapor deposition, chemical vapor deposition or atomic layer deposition process. The thickness of first semiconductor containing conductor layer 15 is typically between 1 nm and 20 nm. In some embodiments, the thickness of the first semiconductor containing conductor layer 15 ranges from 2 nm to 10 nm. In some embodiments, the first semiconductor containing conductor layer 15 is doped with an n-type or p-type dopant.

Figure 3:
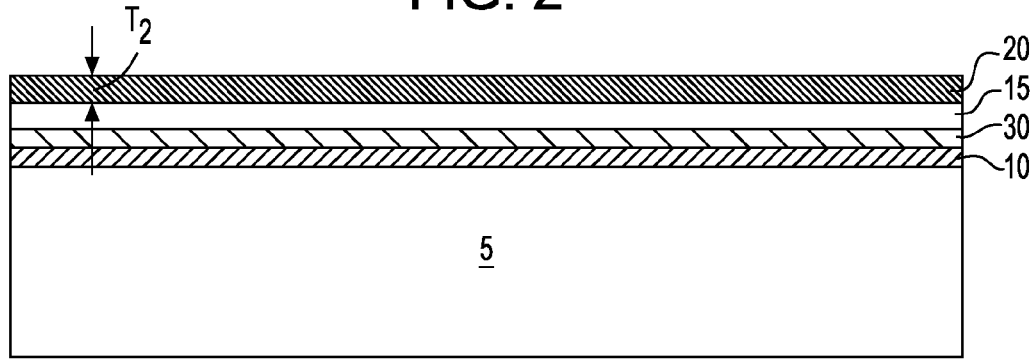
FIG. 3 is a side cross-sectional view depicting one embodiment of forming a boron semiconductor alloy layer on the first semiconductor containing gate conductor layer.

FIG. 3 depicts one embodiment of forming a boron semiconductor alloy layer 20 on the first semiconductor containing gate conductor layer 15. The boron semiconductor alloy layer 20 is separated from the non-stoichiometric high-k gate dielectric layer 30 by the first semiconductor containing conductor layer 15, and therefore does not affect the threshold voltage of the semiconductor device. The non-stoichiometric high-k gate dielectric layer 30 functions as a diffusion stop to stop depletion of the semiconductor materials, such as the later formed second semiconductor containing conductor layer, that are present in the gate structure.

The term "boron semiconductor alloy layer" denotes a substance with metallic properties, composed of two or more chemical elements of which at least one is a boron and another is a semiconductor. In one example, the semiconductor element of the boron semiconductor alloy layer 20 is silicon (Si), in which the boron semiconductor alloy layer 20 can be referred to as a layer composed of a boron and silicon alloy. As used herein, "metallic" is a material with electrically conductive properties. In some embodiments, the electrically conductive properties of the boron semiconductor alloy layer 20 include a sheet resistance of less than 50 Ohm/square. In one example, the sheet resistance of the boron semiconductor alloy layer 20 is less than 25 Ohm/square. In another example, the sheet resistance of the boron semiconductor alloy layer 20 ranges from 10 Ohm/square to 20 Ohm/square. The thickness of the boron semiconductor alloy layer 20 may range from 5 nm to 100 nm. In one embodiment, the thickness of the boron semiconductor alloy layer 20 may range 10 nm to 80 nm. In yet another embodiment, the thickness of the boron semiconductor alloy layer 20 may range from 12 nm to 25 nm.

The boron semiconductor alloy layer 20 can have a thermal stability that can withstand the temperatures of the activation anneal for the later formed source and drain regions. The term "thermal degradation" refers to changes in the metal semiconductor alloy that take place above a specific temperature, making it no longer thermally stable. These changes can result in an increase of resistivity, a change in shape and a change in the compositional homogeneity. Measurements of sheet resistance and physical structure (i.e., XSEM and XTEM) can reveal these changes. For example, the boron semiconductor alloy layer 20 may be thermally stable at temperatures greater than 900° C. In another example, the boron semiconductor alloy layer 20 may be thermally stable at temperatures greater than 950° C., and in some examples may be thermally stable to temperatures as great as 1000° C. By providing enhanced thermal stability to temperatures of 900° C. or greater, the boron semiconductor alloy layer 20 may be subjected to the activation anneal for the source and drain regions. Any change, i.e., shape change, of the boron semiconductor alloy layer 20 during the later described activation anneal of the source and drain regions should be less than 5%. In some embodiments, the heat treated boron semiconductor alloy layer 20 may be rectangular in shape with no evidence of any protrusions.

The boron semiconductor alloy layer 20 can be formed by a deposition method, which co-deposits the boron metal element and the semiconductor elements of the boron semiconductor alloy layer 20 simultaneously. Co-deposition of the metal and semiconductor elements of the boron semiconductor alloy layer 20 is differentiated from depositing a metal layer on a previously formed semiconductor surface and annealing the deposited metal and semiconductor surface to promote co-diffusion of the metal and semiconductor elements to form a silicide, such as practiced in salicide processing. Co-deposition of the metal elements and the semiconductor elements of the boron semiconductor alloy layer 20 may be provided by physical vapor deposition (PVD), chemical vapor deposition (CVD) and atomic layer deposition (ALD).

In one embodiment, co-deposition of the semiconductor elements and the boron elements of the boron semiconductor alloy layer 20 is provided by a dual target sputtering apparatus. Sputtering is a form of physical vapor deposition (PVD). Examples of sputtering apparatuses suitable for the boron semiconductor alloy layer 20 include DC diode type systems, radio frequency (RF) sputtering, magnetron sputtering, and ionized metal plasma (IMP) sputtering. Typically, in the sputtering deposition process, high energy particles strike a solid slab of a high-purity target material, in which the high energy particles physically dislodge atoms of the target material. These sputtered atoms typically migrate through a vacuum and deposit on the deposition surface, e.g., the first semiconductor containing conductor layer 15. In a dual target sputtering system, there are two targets composed of target material. The first target may provide the boron source and the second target may provide a semiconductor source, e.g., silicon (Si) source. The first and second targets may both be charged, e.g., negatively charged, and may be referred to as a cathode. The deposition surface is typically charged opposite, e.g., positively charged, the first and second targets, and is typically referred to as an anode. In another embodiment, sputter deposition of the co-deposited boron and semiconductor elements for the boron semiconductor alloy layer 20 is provided from a single target. For example, when the desired composition of the boron semiconductor alloy layer 20 is a boron silicon alloy, the single target sputtering apparatus would contain one target having the boron silicon alloy composition that is desired to be deposited.

In another embodiment, the boron and semiconductor elements may be co-deposited using chemical vapor deposition (CVD). Chemical vapor deposition (CVD) is a deposition process in which a deposited species is formed as a result of chemical reaction between gaseous reactants at an elevated temperature (typically being greater than 200° C.), wherein solid product of the reaction is deposited on the surface on which a film, coating, or layer of the solid product is to be formed. To provide for co-deposition of the boron and semiconductor elements for the boron semiconductor alloy layer 20, the chemical vapor deposition (CVD) method may include two gas precursors, in which one gas precursor can provide the semiconductor element and the second gas precursor can provide the boron element. For example, when the semiconductor element is silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. Examples of gas precursors for the boron element of the boron semiconductor alloy layer 20 include $B_2H_6$, $BF_3$, $BCl_3$, $B_{10}H_{14}$, $B_{18}H_x$, $B_{36}H_x$, or any other boron-containing molecule.

In another embodiment, the boron and semiconductor elements may be co-deposited using atomic layer deposition (ALD). Atomic layer deposition (ALD) uses sequential self-limiting surface reactions to deposit material layers in the monolayer thickness regime. Atomic layer deposition (ALD) is similar in chemistry to chemical vapor deposition (CVD), except that the atomic layer deposition (ALD) reaction breaks the chemical vapor deposition reaction into two half-reactions, keeping the precursor materials separate during the reaction. Due to the characteristics of self-limiting and surface reactions, atomic layer deposition film growth makes atomic scale deposition control possible. By keeping the precursors separate throughout the coating process, atomic layer control of film growth can be obtained as fine as ~0.1 Å per cycle. Separation of the precursors is accomplished by pulsing a purge gas (typically nitrogen or argon) after each gas precursor pulse to remove excess precursor from the deposition chamber of the atomic layer deposition apparatus.

It is noted that the above described deposition methods are provided for illustrative purposes only and are not intended to limit the present disclosure. The boron semiconductor alloy layer 20 may be deposited using any method that allows for co-deposition of the metal and semiconductor elements on the deposition surface substantially simultaneously.

In some embodiments, the boron semiconductor alloy layer 20 is deposited so that the boron semiconductor alloy layer 20 is separated from the gate dielectric, i.e., non-stoichiometric high-k gate dielectric layer 30, by a sufficient distance to not effect the threshold voltage of the semiconductor device, but still be positioned to be effective as a depletion stop for the later formed overlying semiconductor containing layers of the gate structure. In one embodiment, the boron semiconductor alloy layer 20 is separated from the non-stoichiometric high-k gate dielectric layer 30 by a thickness T2 ranging from 2 nm to 20 nm. In another embodiment, the boron semiconductor alloy layer 20 is separated from the non-stoichiometric high-k gate dielectric layer 30 by a thickness T2 ranging from 2 nm to 20 nm. In yet another embodiment, the boron semiconductor alloy layer 20 is separated from the non-stoichiometric high-k gate dielectric layer 30 by a thickness T2 ranging from 3 nm to 5 nm.

In one example, the boron semiconductor alloy layer 20 is $B_xSi$, wherein x is equal to 2, 4 or 6.

Figure 4:
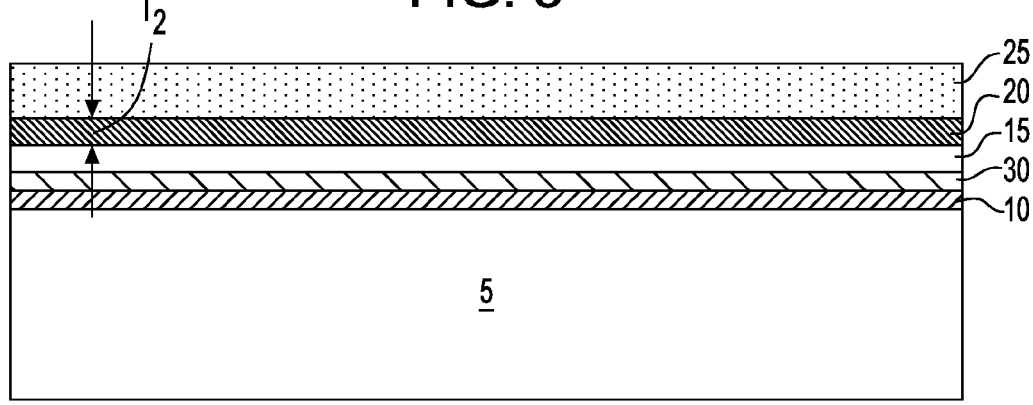
FIG. 4 is a side cross-sectional view depicting forming a second semiconductor containing conductor layer on the boron semiconductor alloy layer, in accordance with one embodiment of the present disclosure.

FIG. 4 depicts one embodiment of forming a second semiconductor containing conductor layer 25 on the boron semiconductor alloy layer 20. The second semiconductor containing layer 25 may be a silicon containing material. Examples of silicon containing materials that are suitable for the second semiconductor containing layer 25 include, but are not limited to, silicon (Si), single crystal silicon, polycrystalline silicon, amorphous silicon (α-Si), Si doped with C (Si:C) and the above-mentioned silicon-containing materials with some or all of the Si replaced by Ge. Other examples of semiconductor materials that are suitable for the second semiconductor containing layer 25 may include GaSb, GaP, GaAs, InAs, InP, and all other III-V or II-VI compound semiconductors. In some embodiments, the second semiconductor containing layer 25 is deposited using a physical vapor deposition, chemical vapor deposition or atomic layer deposition process. The thickness of second semiconductor containing layer 25 is typically between 1 nm and 50 nm. In some embodiments, the thickness of the second semiconductor containing layer 25 ranges from 5 nm to 25 nm.

Figure 5:
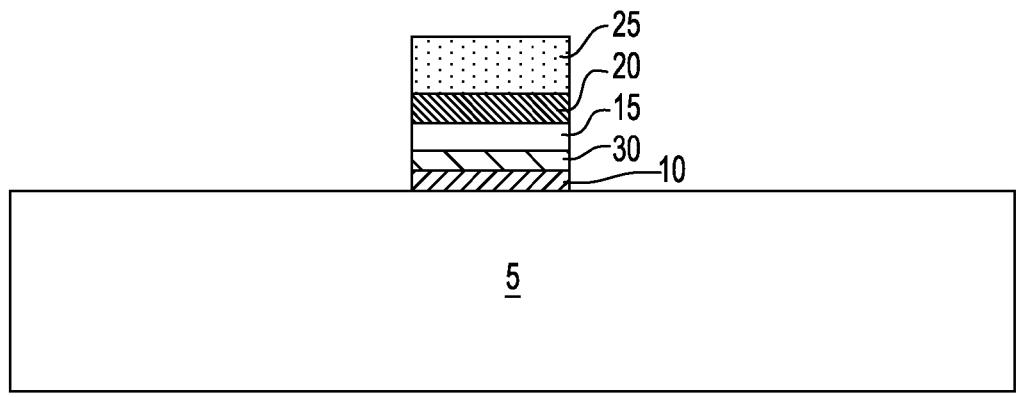
FIG. 5 is a side cross-sectional view depicting one embodiment of patterning the second semiconductor containing conductor layer, the boron semiconductor alloy layer, the first semiconductor containing conductor layer, the non-stoichiometric high-k gate dielectric layer, and the oxide containing interfacial layer to form a gate structure.

FIG. 5 depicts one embodiment of patterning the second semiconductor containing conductor layer 25, the boron semiconductor alloy layer 20, the first semiconductor containing conductor layer 15, the non-stoichiometric high-k gate dielectric layer 30, and the oxide containing interfacial layer 10 to form a gate structure 40. In some embodiments, the gate structure 40 may be patterned using photolithography and etching. More specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. The gate structure 40 controls output current, i.e., flow of carriers in the channel, of the semiconducting device, such as a field effect transistor (FET), through electrical or magnetic fields. The channel of the semiconductor device is the region between the source region and the drain region of the semiconductor device that becomes conductive when the semiconductor device is turned on.

Figure 6:
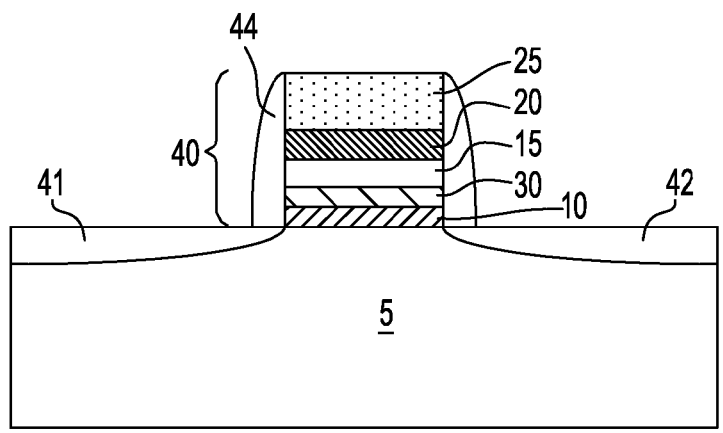
FIG. 6 is a side cross-sectional view depicting forming a source region and a drain region on opposing sides of the gate structure, in accordance with one embodiment of the present disclosure.

Referring to FIG. 6, a source region 41 and a drain region 42 may be formed in the semiconductor substrate 5. In some embodiments, the conductivity type of the source region 41 and the drain region 42 determines the conductivity type of the semiconductor device. The term "conductivity type" denotes whether the semiconductor device has a p-type conductivity or an n-type conductivity. For example, an n-type semiconductor device, such as an n-type field effect transistor, may have a source region 41 and a drain region 42 that are doped to an n-type conductivity. A p-type semiconductor device, such as a p-type field effect transistor, may have a source region 41 and a drain region 42 that are doped to a p-type conductivity. As used herein, "p-type" refers to the addition of impurities to an intrinsic semiconductor that creates deficiencies of valence electrons. The p-type conductivity semiconductor devices are typically produced within silicon containing substrates by doping the source and drain regions 41, 42 adjacent to the gate structure 40a with elements from group III-A of the Periodic Table of Elements. In a silicon containing substrate, examples of p-type dopants, i.e., impurities, include but are not limited to boron, aluminum, gallium and indium. As used herein, "n-type" refers to the addition of impurities that contributes free electrons to an intrinsic semiconductor. The n-type conductivity semiconductor devices are typically produced within silicon containing substrates by doping the source and drain regions 41, 42 with elements from group V-A of the Periodic Table of Elements. In a silicon containing substrate, examples of n-type dopants, i.e., impurities, include but are not limited to, antimony, arsenic and phosphorous.

The source region 41 is the doped region in the semiconductor device, in which majority carriers are flowing into the channel portion of the semiconductor substrate 5. The drain regions 42 are the doped regions in the semiconductor device that are located at the end of the channel portions of the semiconductor substrate 5, in which carriers are flowing out of the semiconductor device through the drain region 42. The source and drain regions 41, 42 be formed via ion implantation. Each of the source region 41 and the drain region 42 may include an extension implant region (depicted as the source region 41 and drain region 42) and a deep implant region (not shown). The extension implant region of the source and drain region 41, 42 typically has the same conductivity type as the deep implant region, but the extension implant region is typically implanted at a lower energy and at a lower concentration than the deep implant region. The extension implant region may be formed before the gate sidewall spacer 44.

Still referring to FIG. 6, in one embodiment, a gate sidewall spacer 44 is formed adjoining the sidewall surfaces of the gate structure 40. In one embodiment, the gate sidewall spacer 44 is composed of silicon oxide, silicon nitride, boron nitride, silicon carbon or any suitable combination of those materials. The gate sidewall spacer 44 may be formed by deposition and etching. Typically, the widths of the gate sidewall spacer 44 should be sufficiently wide enough so that the following deep source and drain implants also do not encroach significantly into the channel portion of the semiconductor substrate 5 to cause short channel effects in the semiconductor device. In one embodiment, the gate sidewall spacer 44 has a width measured at the bottom of the spacer that is no greater than 20 nm.

Still referring to FIG. 6, in one embodiment, a higher energy ion implant than the ion implant used to form the extension implant regions is conducted to form deep implant regions (not shown) of the source and drain regions 41, 42. Typically, these implants are also conducted at higher concentration of dopant than the implant for the extension implant regions. In some embodiments, the deep source and drain regions may be omitted.

Figure 7:
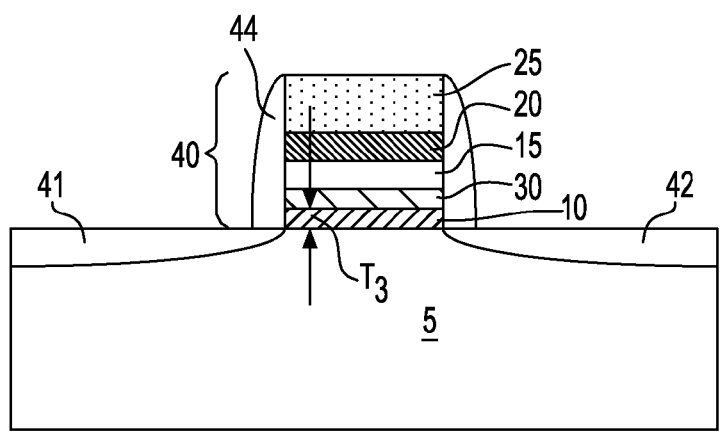
FIG. 7 is a side cross-sectional view of one embodiment of performing an anneal process, wherein during the anneal process the non-stoichiometric high-k gate dielectric layer removes oxide material from the oxide containing interfacial layer.

Referring to FIG. 7, in one embodiment, the source and drain regions 41, 42 can be activated by activation annealing. The anneal process may be at temperatures greater than 800° C., e.g., in the range of approximately 800° C. to 1200° C. In another embodiment, the anneal process may be at a temperature ranging from 900° C. to 1100° C. The anneal process may be provided by at least one of a rapid thermal anneal (RTA) process, a laser-based anneal process, a flashlight-based anneal process or a combination thereof. During the anneal process, the non-stoichiometric high-k gate dielectric layer 30 removes oxide from the oxide containing interfacial layer 10. By removing the oxide material from the oxide containing interfacial layer 10, the thickness of the oxide containing interfacial layer 10 is reduced. In one embodiment, the oxide containing interfacial layer 10 before the annealing process had a thickness greater than 1 nm, and after the annealing process the oxide containing interfacial layer 10 had a thickness T3 ranging from 1 Å to 8 Å. In another embodiment, during the anneal process the non-stoichiometric high-k gate dielectric layer 30 removes oxide from the oxide containing interfacial layer 10, wherein the oxide containing interfacial layer 10 before the annealing process had a thickness greater than 1 nm, and after the annealing process the oxide containing interfacial layer 10 has a thickness ranging from 2 Å to 5 Å. Although the anneal process that removes the oxide material from the oxide containing interfacial layer 10 has been described as an activation anneal, the present disclosure is not limited to only this embodiment. For example, the anneal for removing oxide material from the oxide containing interfacial layer 10 may be conducted at any time after the non-stoichiometric high-k gate dielectric layer 30 has been formed.

FIG. 7 depicts one embodiment of a semiconductor device including a semiconductor substrate 5 including a channel region, a source region 41 and a drain region 42, wherein the source region 41 and the drain region 42 are on opposing sides of the channel region. The semiconductor device further includes a gate structure 40 present on the channel region of the semiconductor substrate 5. The gate structure 40 includes an interfacial oxide containing layer 10 having a thickness of 5 Å or less that is in direct contact with the channel region. A high-k gate dielectric layer, e.g., non-stoichiometric high-k gate dielectric layer 30, can be present on the interfacial oxide containing layer 10. In some embodiments, a semiconductor containing gate conductor, e.g., first semiconductor containing conductor layer 15, is present in direct contact with the high-k gate dielectric layer, e.g., non-stoichiometric high-k gate dielectric layer 30. The term "direct contact" means that a first element, such as the first semiconductor containing conductor layer 15, and a second element, such as the non-stoichiometric high-k gate dielectric layer 30, are connected without any intermediary conducting, insulating or semiconductor layers at the interface of the two elements.

The methods and semiconductor devices that are disclosed herein are suitable for the low voltage, i.e., low threshold voltage (Vdd), semiconductor devices. As used herein, a low voltage, i.e., low threshold voltage (Vdd), semiconductor device has a chip operating voltage that may range from 0.5 volts and 0.8 volts. The semiconductor devices disclosed herein, which employ semiconductor containing gate conductors 15, 25, also have improved performance under burn in conditions and increased reliability when compared to similar semiconductor devices that include metal gate conductors. Burn in is a process in which the chip is operated at a higher voltage than the chip will ever be exposed to during operation. Burn in can remove the components on the chip that are below specification by burning them out. In prior semiconductor devices including a gate structure having a metal gate conductor, an electric field can be produced during the burn in process, which can damage the high-k gate dielectric of the gate structure to the semiconductor device. In some embodiments, the semiconductor devices disclosed herein have semiconductor containing gate conductors 15, 25 in combination with a boron semiconductor alloy layer 30. The boron semiconductor alloy layer 30 reduces depletion of the semiconductor containing gate conductors 15, 25, and the semiconductor containing gate conductors 15, 25 reduce the strength of the electric field that is formed during the burn in process, which reduces damage to the underlying high-k gate dielectric. In some embodiments, the high-k gate dielectric is composed of a non-stoichiometric high-k gate dielectric layer 30 that removes oxide from the oxide containing interfacial layer 10.

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:

1. A method of forming a gate structure for a semiconductor device comprising:

forming a non-stoichiometric high-k gate dielectric layer on a semiconductor substrate, wherein an oxide containing interfacial layer is present between the non-stoichiometric high-k gate dielectric layer and the semiconductor substrate;

forming at least one gate conductor layer including a boron semiconductor alloy layer on the non-stoichiometric high-k gate dielectric layer, wherein the at least one gate conductor layer including a boron semiconductor alloy layer reduces a strength of an electric field that is produced during burn in when compared to a similarly structured semiconductor device having a metal gate conductor; and annealing said non-stoichiometric high-k gate dielectric layer, after forming said at least one gate conductor layer, to remove oxide material from the oxide containing interfacial layer, wherein the oxide containing interfacial layer is thinned by removing the oxide material during said annealing.

2. The method of claim 1, wherein the oxide containing interfacial layer comprises silicon oxide, silicon oxynitride or a combination thereof.

3. The method of claim 1, wherein the oxide containing interfacial layer is formed by applying the semiconductor substrate to an oxygen containing atmosphere or the oxide containing interfacial layer is a chemical oxide that results from applying a chemical cleaning process to the semiconductor substrate.

4. The method of claim 1, wherein the oxide containing interfacial layer before the annealing has a thickness ranging from 0.1 nm to 2 nm.

5. The method of claim 1, wherein the forming of the non-stoichiometric high-k gate dielectric layer includes a deposition process selected from the group consisting of chemical vapor deposition, atomic layer deposition, physical vapor deposition and a combination thereof.

6. The method of claim 5, wherein the non-stoichiometric high-k gate dielectric layer is $HfO_{(2-y)}$, wherein y is greater than 0 and smaller than 2.

7. The method of claim 6, wherein the physical vapor deposition process is selected from sputtering, molecular beam epitaxy, pulsed laser deposition, evaporation, and a combination thereof.

8. The method of claim 1, wherein the forming of the at least one gate conductor layer comprises:

forming a first semiconductor containing gate conductor layer on the non-stoichiometric high-k gate dielectric layer;

forming the boron semiconductor alloy layer on the first semiconductor containing gate conductor layer; and forming a second semiconductor containing gate conductor layer on the boron semiconductor alloy layer.

9. The method of claim 1, wherein at least one of the first and second semiconductor containing gate conductor layer is comprised of polysilicon.

10. The method of claim 1, wherein the forming of the boron semiconductor alloy layer comprises physical vapor deposition to codeposit boron atoms and silicon atoms, or the forming of the boron semiconductor alloy layer comprises applying a boron containing gas to a silicon containing surface.

11. The method of claim 10, wherein the boron semiconductor alloy layer comprises $B_xSi$, wherein x is equal to 2, 3, 4, 6, 14, 15, 40 or a combination.

12. The method of claim 1, wherein the performing of the anneal process comprises a temperature that is greater than 800° C.

13. A method of forming a gate structure for a semiconductor device comprising:

forming a non-stoichiometric high-k gate dielectric layer on a semiconductor substrate, wherein an oxide containing interfacial layer is present between the non-stoichiometric high-k gate dielectric layer and the semiconductor substrate and said oxide containing interfacial layer is formed by applying said semiconductor substrate to an oxygen containing atmosphere or said oxide containing interfacial layer is a chemical oxide that results from applying a chemical cleaning process to said semiconductor substrate; and forming at least one gate conductor layer including a boron semiconductor alloy layer on the non-stoichiometric high-k gate dielectric layer, wherein the at least one gate conductor layer including a boron semiconductor alloy layer reduces a strength of an electric field that is produced during burn in when compared to a similarly structured semiconductor device having a metal gate conductor.

14. The method of claim 13, wherein an anneal process is performed after forming at least one gate conductor layer including a boron semiconductor alloy layer, wherein during the anneal process the non-stoichiometric high-k gate dielectric layer removes oxide material from the oxide containing interfacial layer, wherein the oxide containing interfacial layer is thinned by removing the oxide material during the anneal process.

15. A method of forming a gate structure for a semiconductor device comprising:

forming a non-stoichiometric high-k gate dielectric layer comprising $HfO_{(2-y)}$, wherein y is greater than 0 and smaller than 2 by a deposition process selected from the group consisting of chemical vapor deposition, atomic layer deposition, physical vapor deposition and a combination thereof on a semiconductor substrate, wherein an oxide containing interfacial layer is present between the non-stoichiometric high-k gate dielectric layer and the semiconductor substrate; and forming at least one gate conductor layer including a boron semiconductor alloy layer on the non-stoichiometric high-k gate dielectric layer, wherein the at least one gate conductor layer including a boron semiconductor alloy layer reduces a strength of an electric field that is produced during burn in when compared to a similarly structured semiconductor device having a metal gate conductor.

16. A method of forming a gate structure for a semiconductor device comprising:

forming a non-stoichiometric high-k gate dielectric layer on a semiconductor substrate, wherein an oxide containing interfacial layer is present between the non-stoichiometric high-k gate dielectric layer and the semiconductor substrate; and forming at least one gate conductor layer including a boron semiconductor alloy layer on the non-stoichiometric high-k gate dielectric layer, wherein said forming said boron semiconductor alloy layer comprises physical vapor deposition to codeposit boron atoms and silicon atoms, or applying a boron containing gas to a silicon containing surface, and wherein the at least one gate conductor layer including a boron semiconductor alloy layer reduces a strength of an electric field that is produced during burn in when compared to a similarly structured semiconductor device having a metal gate conductor.

* * * * *